(12) United States Patent
Kim et al.

(10) Patent No.: US 6,411,801 B1
(45) Date of Patent: Jun. 25, 2002

(54) DOUBLE BALANCED ACTIVE MIXER

(75) Inventors: Min-Gun Kim; Sung-Won Kang; Eung-Gie Oh; Jae-Jin Lee, all of Taejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 09/399,832

(22) Filed: Sep. 21, 1999

(30) Foreign Application Priority Data

Nov. 19, 1998 (KR) .................................. 98-49842

(51) Int. Cl.⁷ ................................................ H04B 1/28
(52) U.S. Cl. ....................................................... 455/333
(58) Field of Search ................................. 455/333, 323, 455/313; 327/356, 357, 358, 359

(56) References Cited

U.S. PATENT DOCUMENTS 4,636,663 A    1/1987   Jongepier et al.
5,329,189 A    7/1994   Ushida et al.
5,548,840 A    8/1996   Heck

OTHER PUBLICATIONS

The Multi–Tanh Principle: A Tutorial Overview; Barrie Gilbert, Journal of Solid–State Circuits, vol. 33, No. 1, Jan. 1998, pp. 2–17.

*Primary Examiner*—William Cumming
(74) *Attorney, Agent, or Firm*—Blakely Sokoloff Taylor & Zafman

(57) ABSTRACT

A double balanced active mixer is used for compensating an asymmetric characteristic of complementary radio frequency signals, to thereby improve linearity of the double balanced active mixer. The double balanced active mixer includes an input transistor part for amplifying first and second radio frequency signals having complementary phase each other which are inputted from external circuit and for transferring the amplified first and second radio frequency signals and an Output transistor part for outputting first and second intermediate frequency signals which are complementary each other by switching the amplified first and second radio frequency signals.

2 Claims, 3 Drawing Sheets

US 6,411,801 B1

DOUBLE BALANCED ACTIVE MIXER

FIELD OF THE INVENTION

The present invention relates to a frequency mixer and, more particularly, to a double balanced active mixer for compensating for an asymmetric characteristic of complementary radio frequency signals, thereby improving linearity of the double balanced active mixer.

DESCRIPTION OF THE PRIOR ART

A frequency mixer is used to modulate or mix a radio frequency (hereinafter, referred to as RF) signal with a local oscillation (hereinafter, referred to as LO) signal to produce a different signal having a new frequency component.

As is well known to the art, an MMIC (microwave monolithic integrated circuit) is a circuit integrated together with active and passive elements on a same semiconductor substrate. Therefore, compared with a circuit which is implemented with each individual unit element, the MMIC configuration may reduce a distance between each individual unit element so that a size and weight of the circuit is reduced. In addition, parasitic components caused by a packaging of the individual unit elements can be fundamentally eliminated, thereby highly improving a frequency bandwidth performance. With high demands on a light and small-size wireless/mobile communication equipment and a mass production at a low cost, it is inclined that the MMIC configuration is used to implement microwave parts of the recent wireless/mobile communication by the MMIC configuration. The manufacturing cost of the MMIC is generally proportional to the size, so that it is important to scale down the size of the MMIC.

Meanwhile, a microwave frequency mixer is the most useful in RF parts used for receivers and transmitters. The microwave frequency mixer is an apparatus for modulating or mixing the RF signal with the LO signal to produce an intermediate frequency (hereinafter, referred to as IF) signal, wherein the IF signal corresponds to a difference and sum of the RF and LO signal. A receiving station and a transmitting station widely use a down conversion mixer for converting the RF signal into the IF signal and an up conversion mixer for converting the IF signal into the RF signal, respectively.

Generally, requirements for the microwave frequency mixer used in the receiving station include a low noise, a high gain, an excellent linearity such as a low intermodulation distortion, an excellent signal isolation between input and output terminals of the mixer, a low manufacturing cost and a small size, a low power. consumption and so on. Since a low-capacity battery is used in order to reduce the weight of the mobile station, the use of parts operable at a low power source is essential for an increase of available time. As the number of registers is increasing, it is more desirable for the mobile station to have improved receiving and transmitting characteristics (in particular, the low noise and the high linearity).

The frequency mixer is generally classified by a single ended mixer and a balanced mixer, wherein the balanced mixer is again classified by a single balanced mixer and a double balanced mixer. The balanced mixer will be described in detail.

When the large LO signal used for a frequency conversion is leaked to an output port of the mixer, an normal operation of an amplifier circuit connected back to the mixer may be disturbed. In the down conversion mixer, since a frequency difference between the LO signal and an output signal is large, only the LO signal can be eliminated using a filter. However, in the up conversion mixer, since the frequency of the LO signal is close to the frequency of the output signal, it is difficult to eliminate only the LO signal using the filter.

In this case, a structure known as Gilbert Cell is widely used. The structure of the Gilbert Cell has a double balanced structure, which uses an offset effect between the complementary signals. However, since a balun circuit is used to generate the complementary signals in the structure of the Gilbert Cell, an asymmetry of the signals due to an imperfectness of the balun circuit may occur, therefore resulting in degrading the mixer performance.

FIG. 1 is a schematic diagram illustrating a mixer using the Gilbert Cell according to the prior art. Referring to FIG. 1, the conventional mixer includes an input transistor part 100 for receiving and amplifying the RF+ and RF− signals complementary to each other and an output transistor part 200 for receiving the LO+ and LO− signals complementary to each other and for outputting an IF+ and IF− signals by switching the amplified RF+ and RF− signals from the input transistor part 100.

A positive-phase radio frequency (hereinafter, referred to as RF+) input signal is inputted to a gate of a field effect transistor (hereinafter, referred to as FET) 103 through an input port 101. The RF+ input signal is amplified and outputted as a negative-phase. radio frequency (hereinafter, referred to as RF−) signal at a drain of the FET 103 and the RF− signal from the FET 103 is transferred to a common source of FETs 109 and 110. Similarly, a RF− input signal is inputted to a gate of a FET 104 through an input port 102. The RF− input signal is amplified and outputted as a RF+signal at a drain of the FET 104 and the RF+ signal from the FET 104 is transferred to a common source of FETs 111 and 112.

A positive-phase local oscillation (hereinafter, referred to as LO+) input signal is inputted to a gate of the FET 109 through an input port 106 and the RF− signal which is transferred from the source to a drain of the FET 109 is switched in response to the LO+ input signal. Similarly, the LO+ signal is inputted to a gate of the FET 112 through an input port 107 and the RF+ signal which is transferred from the source to a drain of the FET 112 is switched in response to the LO+ input signal.

Furthermore, a negative-phase local oscillation (hereinafter, referred to as LO−) input signal is inputted to a common gate of FETs 110 and 111 through an input port 108 and the RF− signal which is transferred from the source to a drain of the FET 110 is switched in response to the LO− signal. Similarly, the RF+ signal which is transferred from the source to a drain of the FET 111 is switched in response to the LO− signal.

Through the switching operations as described above, a positive-phase intermediate frequency (hereinafter, referred to as IF+) signal at the common drain of the FETs 109 and 111 is outputted to an output port 113 and a negative-phase intermediate frequency (hereinafter, referred to as IF−) signal at the common drain of the FETs 110 and 112 is outputted to an output port 114.

At this time, in case where the RF+ and RF− input signals inputted to the FETs 101 and 102, respectively, are ideally complementary signals each other, the IF+ and IF− signals also have a complementary characteristic. However, in case where the RF+ and RF− signals is generated using the balun circuit, an asymmetry of the signals may occur, resulting in the asymmetry of the IF+ and IF− signals in the phase and amplitude.

SUMMARY OF THE INVENTION

It is, therefore, an object of the present invention to provide a double balanced active mixer for compensating for an asymmetric characteristic of complementary radio frequency signals, thereby improving linearity of the double balanced active mixer.

In accordance with an aspect of the present invention, there is provided a double balanced active mixer for compensating for asymmetry of radio frequency signals, comprising an input transistor part for amplifying first and second radio frequency signals having complementary phase each other which are inputted from external circuit and for transferring the amplified first and second radio frequency signals and an output transistor part for outputting first and second intermediate frequency signals which are complementary each other by switching the amplified first and second radio frequency signals, wherein the input transistor part comprises: a) a first transistor for receiving the first radio frequency signal from the external circuit through a gate of the first transistor and for amplifying the first radio frequency signal and outputting a amplified radio frequency signal to a drain of the first transistor; b) a second transistor for receiving the second radio frequency signals from the external circuit through a gate of the second transistor and for amplifying the second radio frequency signal and outputting the amplified signal to a drain of the second transistor; c) a third transistor for receiving the first radio frequency signal through a source and for amplifying the first radio frequency signal and outputting a amplified signal to the common drain of the second and third transistor; and d) a fourth transistor for receiving the second radio frequency signal at a source and for amplifying the second radio frequency signal and outputting a fourth resulting signal to the common drain of the first and fourth transistor.

In accordance with another aspect of the present invention, there is provided a double balanced active mixer, comprising: a) a first input port for receiving a first radio frequency having a positive phase; b) a second input port for receiving a second radio frequency having a negative phase; c) a third input port for receiving a first local oscillation signal having a positive phase; d) a fourth input port for receiving a second local oscillation signal having a negative phase; e) a first output port for outputting a first intermediate frequency having a positive phase; f) a second output port for outputting a second intermediate frequency having a negative phase; g) a first transistor which has a gate connected to the first input port and a source connected to the ground voltage level; h) a second transistor which has a gate connected to the second input port and a source connected to the ground voltage level; i) a third transistor which has a source connected to the first input port, a drain connected to a first node and a gate connected to the virtual RF ground terminal; j) a fourth transistor which has a source connected to the second input port, a drain commonly connected to a second node and a gate connected to the virtual RF ground terminal; k) a fifth transistor which has a gate connected to the third input port and a source connected to the first node; l) a sixth transistor which has a gate connected to the third input port and a source connected to the second node; m) a seventh transistor which has a gate connected to. the fourth input port and a source connected to the first node and a drain connected to a drain of the sixth transistor at the second output port; and n) a eighth transistor which has a gate connected to the fourth input port and a source connected to the second node and a drain connected to a drain of the fifth transistor at the second output node.

BRIEF DESCRIPTION OF THE DRAWINGS

The above and other objects and features of the present invention will become apparent from the following description of the preferred embodiments given with conjunction to the accompanying drawings, in which.

DETAILED DESCRIPTION OF THE PREFERRED EMBODIMENTS

Hereinafter, the present invention will be described in detail referring to the accompanying drawings.

Figure 1:
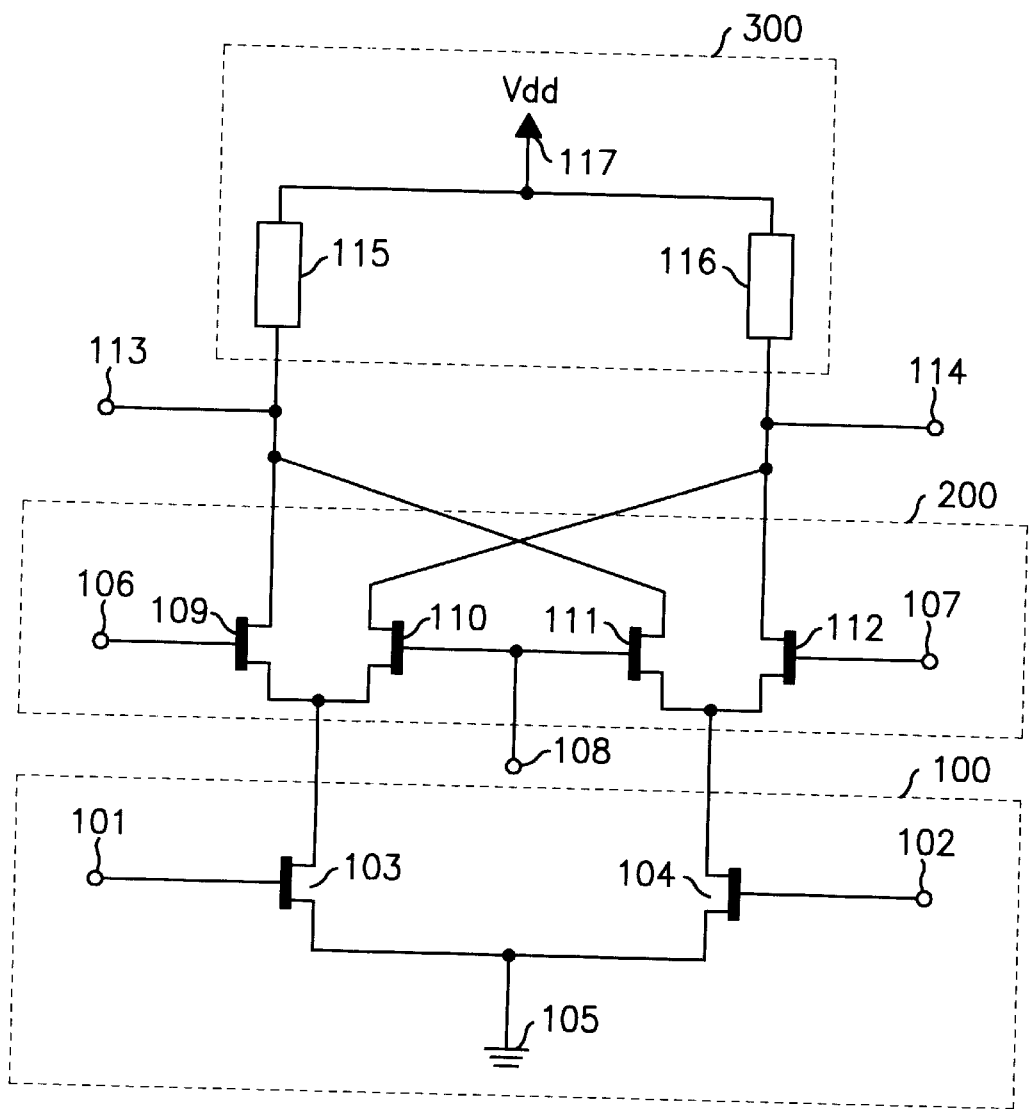
FIG. 1 is a schematic diagram illustrating a double balanced active mixer using Gilbert Cell according to the prior art.
Figure 2:
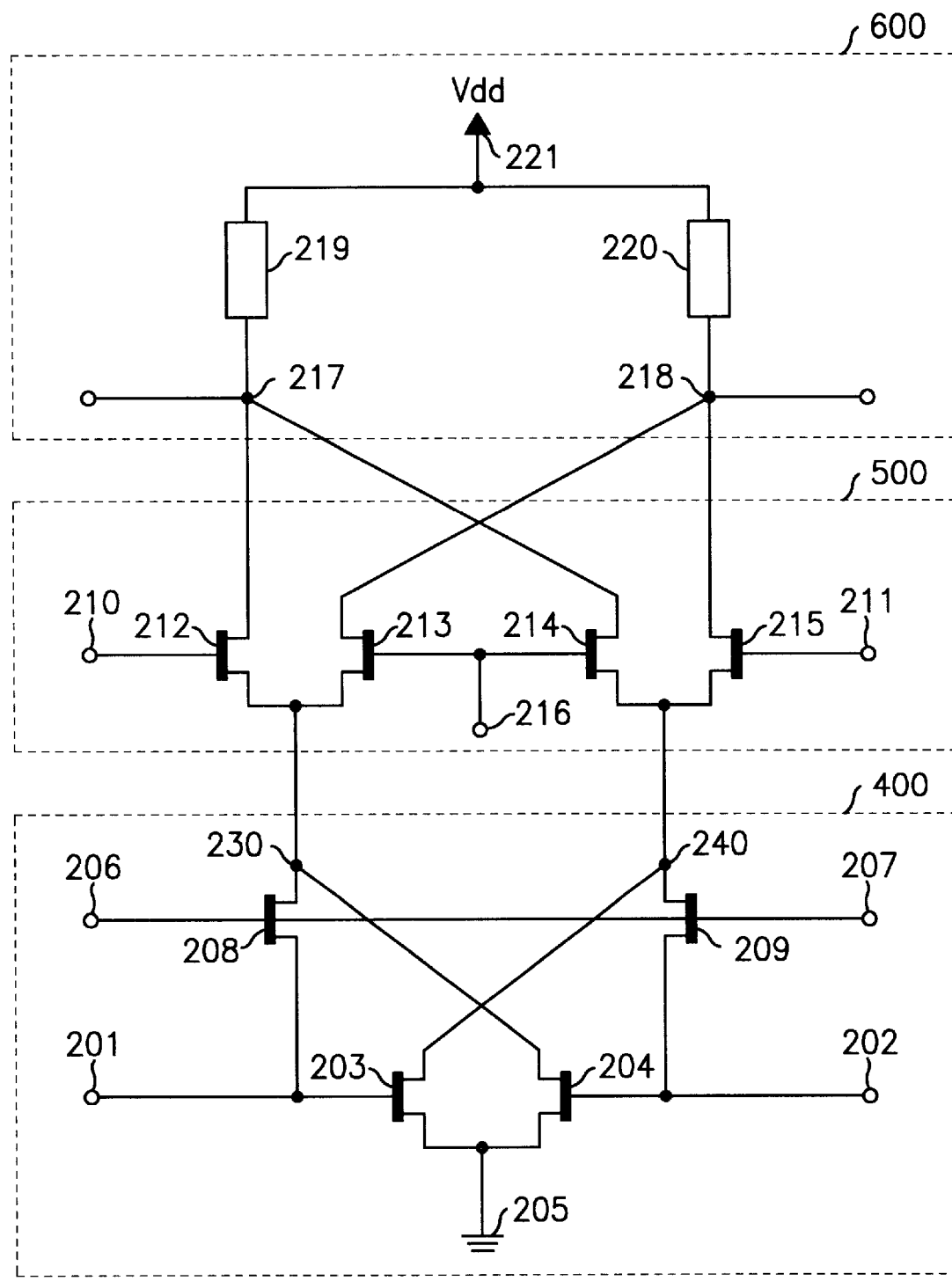
FIG. 2 is a schematic diagram illustrating a double balanced active mixer in accordance with the present invention.

Referring to FIG. 2, an input transistor part 400 receives RF+ and RF− input signals complementary to each other from an external circuit, amplifies each of the RF+ and RF− input signals and transfers the amplified RF+ and RF− signals. An output transistor part 500 outputs IF+ and IF− signals switching the amplified RF+ and RF− signals from the input transistor part 400 in response to LO+ and LO− signals complementary to each other from an external circuit. Here, the input transistor part 400 includes FETs 203 and 204, whose gates receive the RF+ and RF− input signals, respectively, and amplify each of the RF+ and RF− input signals and FETs 208 and 209, whose sources receive the RF+ and RF− input signals, respectively, and amplify each of the RF+ and RF− input signals.

Preferably, the FETs can be replaced with p-channel FETs or n-channel FETs. It is also possible to replace them with bipolar transistors.

The structure of the double balanced active mixer will be described in detail.

The FET 203 has a gate and a source connected to an input port 201 and the ground voltage level 205, respectively, and the FET 204 has a gate and a source connected to an input port 202 and the ground voltage level 205, respectively. The FET 208 has a source connected to the input port 201, a drain commonly connected to a drain of the FET 204 at a first node 230 and a gate connected to the virtual RF ground terminal 206. The FET 209 has a source connected to the input port 207 and a drain commonly connected to a drain of the FET 203 at a second node 240 and a gate connected to the virtual RF ground terminal 207. A FET 212 has a gate and a source connected to an input port 210 and the first node 230, respectively, and a FET 215 has a gate and a source connected to an input port 211 and the second node 240, respectively. A FET 213 has a gate and a source connected to an input port 216 and the first node 230, respectively, and a drain commonly connected to a drain of the FET 215 at an output node 218. A FET 214 has a gate and a source connected to the input node 216 and the second node 240, respectively, and a drain commonly connected to a drain of the FET 217 at an output node 217. The output nodes 217 and 218 are connected to the power supply voltage 221 through loads 219 and 220.

In above-mentioned structure, an asymmetry of the complementary RF+ and RF− signals is compensated using a pair of common-source and common-gate FETs, thereby providing a double balanced active mixer with improved linearity.

Referring again to FIG. 2, the operation of the double balanced active mixer will be described in detail.

Some of the RF+ input signal inputted to the gate of the FET 203 is amplified and the amplified signal is outputted as a RF− signal at the drain of the FET 203. The other of the RF+ input signal simultaneously inputted to the source of the FET 208 is amplified and the amplified signal is outputted as a RF+ signal at the drain of the FET 208. Similarly, some of the RF− input signal inputted to the gate of the FET 204 is amplified and the amplified signal is outputted as a RF+ signal at the drain of the FET 204. The other of the RF− input signal simultaneously inputted to the source of the FET 209 is amplified and the amplified signal is outputted as a RF− signal at the drain of the FET 209. The RF+ signal outputted from the drains of the FETs 204 and 208 is transferred to the common source of the FETs 212 and 213. Similarly, the RF− signal outputted from the drains of the FETs 203 and 209 is transferred to the common source of the FETs 214 and 215.

The LO+ signal is inputted to the gate of the FET 212 through the input port 210 and the RF+ signal of the common node 230 transferred from the source to the drain of the FET 212 is switched in response to the LO+ signal. The LO+ signal is inputted to the gate of the FET 215 and the RF− signal of the common node 240 transferred from the source to the drain of the FET 215 is switched in response to a LO+ signal. The RF+ and RF− signals of the sources of the FETs 213 and 214, respectively, are transferred to the drains of the FETs 213 and 214 in response to the LO− signal inputted to the common gate of the FETs 213 and 214.

Through the above-mentioned switching operations, an IF+ signal is generated at the common drain of the FETs 212 and 214 and an IF− signal is generated at the common drain of the FETs 215 and 213.

At this time, in case where the RF+ input signal inputted through the input port 201 is larger than the RF− input signal inputted through the input port 202 due to the asymmetry of the RF+ and RF− input signals, some of the large RF+ input signal inputted to the gate of the FET 203 through the input port 201 is amplified and outputted as a large RF− signal at the drain of the FET 203. The other of the large RF+ input signal inputted to the source of the FET 208 is outputted as a large RF+ signal at the drain of the FET 208. Similarly, some of the small RF− input signal inputted to the gate of the FET 204 through the input port 202 is amplified and outputted as a small RF+ signal at the drain of the FET 204. The other of the small RF− signal inputted to the source of the FET 209 is amplified and outputted as a small RF− signal at the drain of the FET 209.

Accordingly, the signal inputted to the source of the FET 213 corresponds to a sum of the large RF+ signal and the small RF+ signal from the drains of the FETs 208 and 204, respectively. Similarly, the signal inputted to the source of the FET 214 corresponds to a sum of the large RF− signal and small RF− signal from the drains of the FETs 203 and 209. Therefore, the asymmetric signals inputted through the input ports 201 and 202 are compensated.

Figure 3:
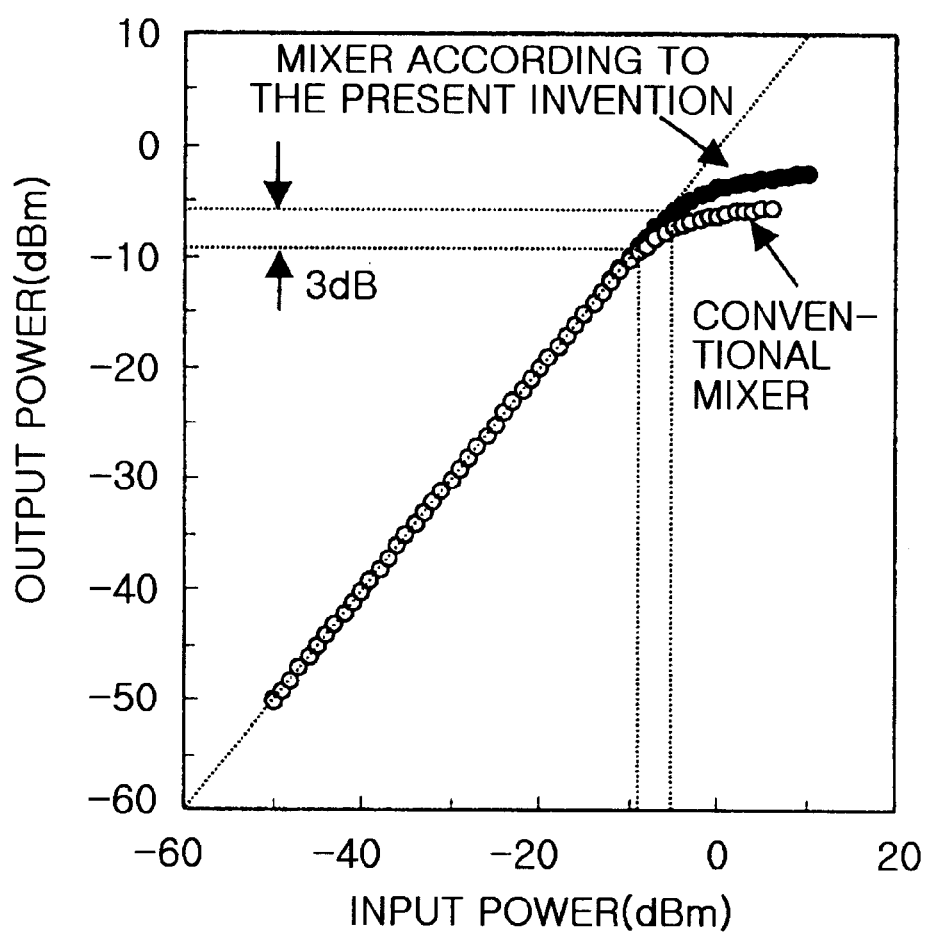
FIG. 3 is a graph illustrating linear characteristic comparing the prior art with the present invention.

As shown in FIG. 3, an 1 dB gain compress point is improved by 3 dB compared with the prior art.

While the present invention has been described with respect to certain preferred embodiments only, other modifications and variation may be made without departing from the spirit and scope of the present invention as set forth in the following claims.

What is claimed is:

1. A double balanced active mixer for compensating for asymmetry of radio frequency signals, comprising an input transistor part for amplifying first and second radio frequency signals having complementary phase each other which are inputted from external circuit and for transferring the amplified first and second radio frequency signals and an output transistor part for outputting first and second intermediate frequency signals which are complementary each other by switching the amplified first and second radio frequency signals, wherein the input transistor part comprises:

a) a first transistor for receiving the first radio frequency signal from the external circuit through a gate of the first transistor and for amplifying the first radio frequency signal and outputting a amplified radio frequency signal to a drain of the first transistor;

b) a second transistor for receiving the second radio frequency signals from the external circuit through a gate of the second transistor and for amplifying the second radio frequency signal and outputting the amplified signal to a drain of the second transistor;

c) a third transistor for receiving the first radio frequency signal through a source and for amplifying the first radio frequency signal and outputting a amplified signal to the common drain of the second and third transistor; and d) a fourth transistor for receiving the second radio frequency signal at a source and for amplifying the second radio frequency signal and outputting resulting signal to the common drain of the first and fourth transistor.

2. A double balanced active mixer, comprising:

a) a first input port for receiving a first radio frequency having a positive phase;

b) a second input port for receiving a second radio frequency having a negative phase;

c) a third input port for receiving a first local oscillation signal having a positive phase;

d) a fourth input port for receiving a second local oscillation signal having a negative phase;

e) a first output port for outputting a first intermediate frequency having a positive phase;

f) a second output port for outputting a second intermediate frequency having a negative phase;

g) a first transistor which has a gate connected to the first input port and a source connected to the ground voltage level;

h) a second transistor which has a gate connected to the second input port and a source connected to the ground voltage level;

i) a third transistor which has a source connected to the first input port, a drain connected to a first node and a gate connected to the virtual RF ground terminal;

j) a fourth transistor which has a source connected to the second input port, a drain commonly connected to a second node and a gate connected to the virtual RF ground terminal;

k) a fifth transistor which has a gate connected to the third input port and a source connected to the first node;

l) a sixth transistor which has a gate connected to the third input port and a source connected to the second node;

m) a seventh transistor which has a gate connected to the fourth input port and a source connected to the first node and a drain connected to a drain of the sixth transistor at the second output port; and n) a eighth transistor which has a gate connected to the fourth input port and a source connected to the second node and a drain connected to a drain of the fifth transistor at the first output port.

\* \* \* \* \*